US012776771B2

(12) United States Patent
Greither

(10) Patent No.: US 12,776,771 B2
(45) Date of Patent: Oct. 27, 2026

(54) AIRCRAFT SOLID STATE POWER CONTROLLER, AIRCRAFT POWER SUPPLY SYSTEM, AND METHOD OF SWITCHING AN AIRCRAFT SOLID STATE POWER CONTROLLER

(71) Applicant: HS Elektronik Systeme GmbH, Nördlingen (DE)

(72) Inventor: Markus Greither, Augsburg (DE)

(73) Assignee: HS Elektronik Systeme GmbH, Nordlingen (DE)

( * ) Notice: Subject to any disclaimer, the term of this patent is extended or adjusted under 35 U.S.C. 154(b) by 70 days.

(21) Appl. No.: 18/626,928

(22) Filed: Apr. 4, 2024

(65) Prior Publication Data

US 2024/0340002 A1 Oct. 10, 2024

(30) Foreign Application Priority Data

Apr. 6, 2023 (EP) .................................... 23166927

(51) Int. Cl.

*H03K 17/00* (2006.01)
*H02H 3/08* (2006.01)
*H03K 17/082* (2006.01)
*H03K 17/12* (2006.01)
*H03K 17/567* (2006.01)

(52) U.S. Cl.

CPC ............. *H03K 17/567* (2013.01); *H02H 3/08* (2013.01); *H03K 17/0822* (2013.01); *H03K 17/122* (2013.01)

(58) Field of Classification Search

CPC ...... H03K 17/567; H03K 17/122; H02H 3/08; H02J 2310/48; H02J 1/08; H02J 1/14

See application file for complete search history.

(56) References Cited

U.S. PATENT DOCUMENTS

| | | | |
|---|---|---|---|
| 8,570,697 | B2 | 10/2013 | Stevens et al. |
| 9,859,837 | B2 | 1/2018 | Yang et al. |
| 10,594,133 | B2 | 3/2020 | Eberts et al. |

(Continued)

OTHER PUBLICATIONS

Extended European Search Report in connection with counterpart European Patent Application No. 23166927.6 dated Oct. 23, 2023, 9 pages.

*Primary Examiner* — Tuan T Lam

(57) ABSTRACT

An aircraft solid state power controller (SSPC) includes a first input terminal, first output terminal, and first electric power switching device switchable between (i) an on-state that electrically couples the first output terminal with the first input terminal and (ii) an off-state that electrically isolates the first output terminal from the first input terminal. The SSPC also includes a second input terminal, second output terminal, and second electric power switching device switchable between (i) an on-state that electrically couples the second output terminal with the second input terminal and (ii) an off-state that electrically isolates the second output terminal from the second input terminal. The SSPC further includes a switch controller configured to synchronously switch the electric power switching devices from their respective on-states into respective off-states. In addition, the SSPC includes an energy dumping circuit configured to dissipate inductive energy generated when the electric power switching devices are switched.

21 Claims, 3 Drawing Sheets

(56) References Cited

U.S. PATENT DOCUMENTS

| | | | | |
|---|---|---|---|---|
| 2017/0054438 | A1* | 2/2017 | Handy | H02H 3/05 |
| 2018/0375505 | A1 | 12/2018 | Handy et al. | |
| 2021/0408779 | A1* | 12/2021 | Chin | H02H 9/026 |
| 2023/0064439 | A1* | 3/2023 | Miura | H02M 7/125 |
| 2024/0120775 | A1* | 4/2024 | Ishida | H02J 7/02 |

* cited by examiner

AIRCRAFT SOLID STATE POWER CONTROLLER, AIRCRAFT POWER SUPPLY SYSTEM, AND METHOD OF SWITCHING AN AIRCRAFT SOLID STATE POWER CONTROLLER

CROSS-REFERENCE TO RELATED APPLICATION AND PRIORITY CLAIM

This application claims priority under 35 U.S.C. § 119 to European Patent Application No. 23166927.6 filed on Apr. 6, 2023, which is hereby incorporated by reference in its entirety.

TECHNICAL FIELD

The present invention is related to electric power supply in an aircraft. The present invention is in particular related to an aircraft solid state power controller, to an aircraft power supply system comprising an aircraft solid state power controller, and to a method of switching an aircraft solid state power controller.

BACKGROUND

Modern aircraft often comprise at least one aircraft power controller, in particular an aircraft solid state power controller ("SSPC"), for controlling the supply of electric power from an electric power supply to at least one electric load within an aircraft. Aircraft power controllers may comprise solid state switches for selectively switching the supply of electric power from the electric power supply to the at least one electric load.

In cause of a malfunction within the electric system of the aircraft, excessively large electric currents may flow through the solid state switches of an aircraft power controller. These electric currents may cause overheating and consequently result in damaging the solid state switch and/or electric lines coupled to the solid state switch. The solid state switches of an aircraft power controller are therefore configured to switch off in case of excessively large electric currents flowing through the aircraft power controller.

When the solid state switches of the aircraft power controller are switched off for interrupting the supply of electric power to an electric load that is electrically connected to the SSPC, relatively high inductive voltages may be generated by inductive loads and/or within the power supply lines. Such inductive voltages may damage components of the SSPC and/or other electric components, which are electrically connected to the SSPC. High inductive voltages may in particular damage the solid state power switches that are employed within the SSPC for controlling the supply of electric power to the electric load. Thus, the inductive energy associated with the inductive voltages needs to be dissipated in order to avoid damaging the solid state switches.

It therefore would be beneficial to provide an SSPC that allows efficiently dissipating the energy associated with the inductive voltages that are generated when the solid state switches of the SSPC are switched into an off-state.

SUMMARY

Exemplary embodiments of the invention include an SSPC for controlling electric power in an aircraft, wherein the electric power is provided by a symmetric electric power supply. The symmetric electric power supply has first and second power supply outputs. The symmetric electric power supply provides a positive supply voltage with respect to a common ground at one of the first and second power supply outputs, and it provides a negative supply voltage with respect to the common ground at the other one of the first and second power supply outputs.

The SSPC comprises a first input terminal, a first output terminal, a second input terminal, and a second output terminal. The first input terminal is provided for being electrically coupled to the first power supply output of the symmetric electric power supply, and the second input terminal is provided for being electrically coupled to the second power supply output of the symmetric electric power supply.

The SSPC further comprises a first electric power switching device and a second electric power switching device. The first electric power switching device is switchable between an on-state, in which the first electric power switching device electrically couples the first output terminal with the first input terminal, and an off-state, in which the first electric power switching device electrically isolates the first output terminal from the second input terminal. The second electric power switching device is switchable between an on-state, in which the second electric power switching device electrically couples the second output terminal with the second input terminal, and an off-state, in which the second electric power switching device electrically isolates the second output terminal from the second input terminal.

The SSPC also comprises a switch controller for controlling the operation of the first and second electric power switching devices. The switch controller is configured for synchronously switching the first and second electric power switching devices from their respective on-states into their respective off-states.

The SSPC further comprises an energy dumping circuit, which is electrically coupled to the first and second input terminals for dissipating inductive energy that is generated when the first and second electric power switching devices are switched from their respective on-states into their respective off-states.

Exemplary embodiments of the invention further include an aircraft power supply system comprising a symmetric electric power supply providing a positive supply voltage with respect to a common ground at one of first and second power supply outputs of the symmetric electric power supply, and a negative supply voltage with respect to the common ground at the other one of the first and second power supply outputs of the symmetric electric power supply. The aircraft power supply system further comprises an SSPC according to an exemplary embodiment of the invention, which is coupled to the symmetric electric power supply.

In particular embodiments, the electric power supply may be configured for supplying electric DC power having voltages in the range of +/−250 V to +/−300 V with respect to a common ground. The electric power supply may in particular be configured for supplying electric DC power with voltages of +/−270 V with respect to the common ground. By providing electric DC power with voltages of at least +/−250 V instead of lower voltages, the electric currents that are necessary for providing the desired electric power to the electric loads may be reduced. Higher power supply voltages, such as power supply voltages in the range of +/−250 V to +/−300 V allow for distributing electric power to electric loads that require more power compared to traditional power supply systems operating with lower power supply voltages, for example with power supply voltages of 28 V.

Exemplary embodiments of the invention also include an aircraft that is equipped with an aircraft power supply system according to an exemplary embodiment of the invention and/or with at least one SSPC according to an exemplary embodiment of the invention.

An SSPC according to an exemplary embodiment of the invention allows for dissipating the inductive energy associated with the inductive voltages that are generated when the first and second electric power switching devices are switched into an off-state by provision of the dumping circuit, which is coupled to the first and second input terminals of the SSPC.

By synchronously switching the first and second electric power switching devices from their respective on-states into their respective off-states, an inductive voltage that is generated when the first and second electric power switching devices are switched off, is applied to each of the first and second electric power switching devices with respect to ground. Thus, the inductive voltage applied between the first input terminal and the first output terminal of the first electric power switching device, as well as the inductive voltage applied between the second input terminal and the second output terminal of the second electric power switching device, respectively, is only half the inductive voltage that is generated in the load and or supply circuit (between the positive and negative poles thereof). Nevertheless, when using an energy dumping circuit, which is electrically connected in between the first input terminal of the first electric power switching device and the second input terminal of the second power switching device, for dissipating inductive energy that is generated when the first and second electric power switching devices are switched from their respective on-states into their respective off-states, the full inductive voltage generated in the load/supply circuit is applied to the energy dumping circuit. Thus, the transient voltage difference between an input and an output of the energy dumping circuit is twice the voltage difference between the first input terminal and the first output terminal of the first power switching device, as well as twice the voltage difference between the second input terminal and the second output terminal of the second power switching device. An energy dumping circuit component or sub-circuit of the energy dumping circuit is thus only required to be activated at an activation voltage difference significantly above the normal maximum operative voltage difference between first/second input terminal and first/second output terminal of the first/second power switching device, respectively. Increasing the activation voltage difference provides a larger window for the break-through voltage of dumping circuit. This facilitates the dimensioning of the dumping circuit and allows for larger tolerances of the break-through voltage of the dumping circuit. As a result, an SSPC according to an exemplary embodiments of the invention may be more easily provided with a dumping circuit that is very efficient in dissipating the inductive electric energy associated with the inductive voltages that are generated when the electric power switching device is switched off.

Optional features of an SSPC according to an exemplary embodiment of the invention are set out in the following:

Synchronously switching the first and second electric power switching devices may include switching the first and second electric power switching devices so that the time difference between switching the first electric power switching device and the second electric power switching device is less than 10 μs, in particular less than 5 μs, more particular less than 1 μs.

For dissipating the inductive energy, the energy dumping circuit may comprise a transient voltage suppressor diode ("TVS diode"). A TVS diode provides an efficient, reliable and inexpensive tool for dissipating the inductive energy.

As an alternative to a TVS diode, s metal-oxide varistor (MOV) may be used.

As another alternative, the energy dumping circuit may comprise a snubber circuit including a snubber capacitor, a snubber resistor and a snubber diode.

When a snubber circuit is employed, the transient energy, which is generated by induction in the aircraft electric power supply system, in particular in the first and second power supply lines of the aircraft electric power supply system, when the electric power switching devices are synchronously switched off, is first absorbed by the snubber capacitor. The transient energy, which is absorbed in the snubber capacitor, may be dissipated later. Alternatively, the transient energy may be recuperated. As a result, the implementation of a snubber circuit provides additional flexibility in the thermal design of the aircraft electric power supply system.

In the snubber circuit, the snubber resistor and the snubber diode may be electrically coupled in parallel to each other, and the snubber capacitor may be electrically coupled to the parallel combination of the snubber resistor and the snubber diode in a serial configuration.

The snubber capacitor may have an electric capacity in the range of 1 μF to 100 μF, in particular in the range of 1 μF to 10 μF or in the range of 10 μF to 100 μF. The snubber resistor may have an electric resistance in the range of 1 kΩ to 100 kΩ, in particular in the range of 1 kΩ to 10 kΩ or in the range of 10 kΩ to 100 kΩ. Capacities and resistances selected from these ranges have been found as resulting in highly efficient snubber circuits.

For dissipating inductive voltages that are generated over the first and second electric power switching devices, when these power switching devices are switched off, the SSPC may further comprise a first clamping circuit, which is connected parallel to the first electric power switching device, and second clamping circuit, which is connected in parallel to the second electric power switching device.

Each of first and second clamping circuits may comprise a clamping diode, in particular clamping TVS diode, which is connected in parallel to the respective electric power switching device. The clamping diodes are oriented in their respective blocking directions with respect to the voltage supplied by the aircraft power supply in normal operation.

In an alternative embodiment, the first and second clamping circuits may by active clamping circuits comprising active switching elements, such as FETs, in particular MOSFETs, which are configured for absorbing transient voltage peaks that are generated over the first and second electric power switching devices.

These first and second clamping circuits are provided in order to prevent one sided overvoltage in case the transient voltages are not identical.

The first and second electric power switching devices may include solid state power switching devices. The first and second electric power switching devices may, for example, include FETs, in particular MOSFETs. Solid state power switching devices such as FETs or MOSFETs provide efficient, reliable and inexpensive electric power switching devices.

The first and second electric power switching devices may be configured to withstand transient voltage peaks of up to 900 V between the input and output terminals thereof, in particular transient voltage peaks of up to 1200 V. Such first and second electric power switching devices are well suited for being employed in SSPCs that are configured to be operated at power supply voltages in the range from +/−250 V to +/−300 V, in particular at power supply voltages of +/−270 V.

The first and second electric power switching devices may be configured to withstand transient electric currents of up to 25 A.

The SSPC may further comprise a freewheeling diode, which is connected in its blocking direction between the first and second output terminals of the SSPC for dissipating inductive energy that is generated on the load side of the SSPC. Here, the term "blocking direction" refers to the conventional polarization of the electric power supply during normal operation.

In the following, SSPCs according to exemplary embodiments of the invention will be described in more detail with reference to the enclosed figures.

DETAILED DESCRIPTION

Figure 1:
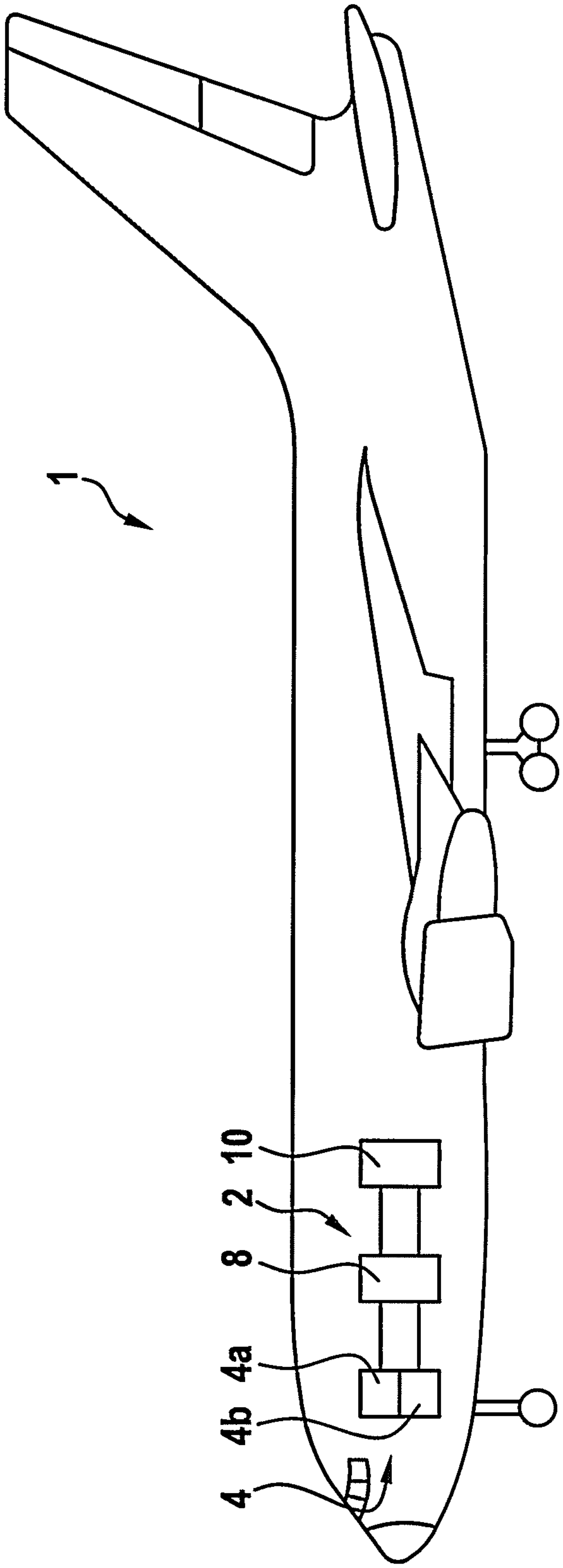
FIG. 1 depicts a schematic side view of an aircraft comprising an aircraft electric power supply system including an aircraft solid state power controller ("SSPC") according to an exemplary embodiment of the invention.

FIG. 1 shows a schematic view of an aircraft 1, in particular of an airplane, which is equipped with an aircraft electric power supply system 2 including an aircraft electric power supply 4, in a particular a symmetric electric power supply 4, an electric load 10, and an SSPC 8 according to an exemplary embodiment of the invention. The SSPC 8 is configured for controlling the supply of electric power from the aircraft electric power supply 4 to the electric load 10.

Although the aircraft electric power supply system 2, as it is depicted in FIG. 1, includes only a single aircraft electric power supply 4, a single electric load 10, and a single SSPC 8, respectively, embodiments of an aircraft electric power supply system 2 according to the present disclosure may comprise more the one of each of said components, respectively. Typically, an aircraft power supply system 2 includes a plurality of electric loads 10 and a plurality of SSPCs 8 assigned to these loads 8.

An aircraft electric power supply system 2 may in particular include a plurality of SSPCs 8, wherein each SSPC 8 includes numerous SSPC channels.

Figure 2:
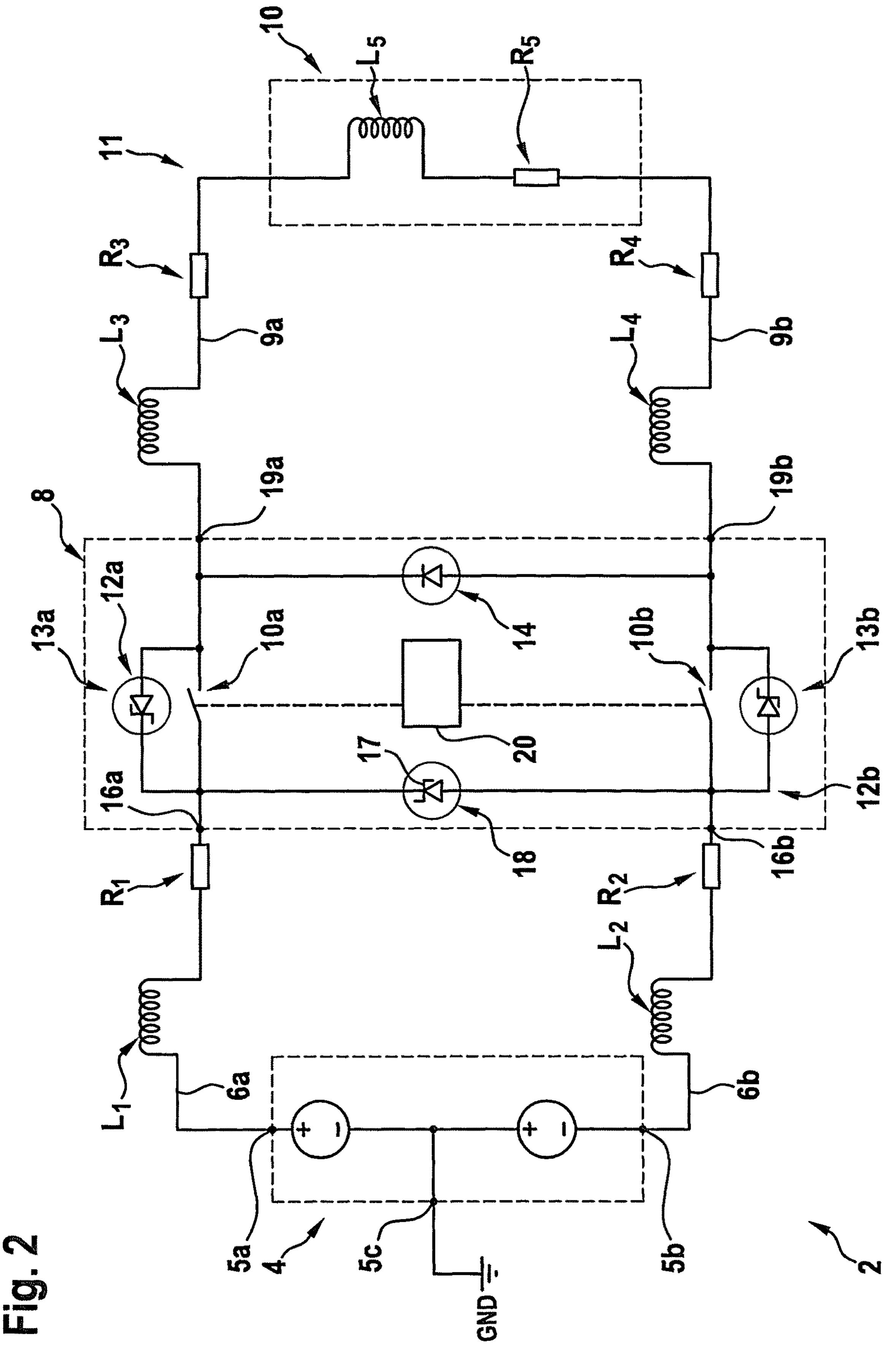
FIG. 2 depicts an electric circuit diagram of an aircraft electric power supply system comprising an SSPC according to an exemplary embodiment of the invention.

FIG. 2 depicts an electric circuit diagram of an aircraft electric power supply system 2 comprising an SSPC 8 according to an exemplary embodiment of the invention.

The aircraft electric power supply system 2 comprises a symmetric electric power supply 4 with power supply outputs 5*a*, 5*b*, namely a first power supply output 5*a* and a second power supply output 5*b*.

The symmetric electric power supply 4 may provide a DC power output. With respect to a common ground GND, which is electrically coupled to a third output 5*c* of the electric power supply 4, a positive supply voltage U+ is provided at the first power supply output 5*a*, and a negative supply voltage U− is provided with respect to a common ground GND at the second power supply output 5*b*. Alternatively, the supply may be floating with only a high impedance, potential defining center connection to the common ground GND.

The positive and negative supply voltages U+/U− may be in the range of +/−250 V to +/−300 V, in particular approximately +/−270 V.

A first power supply line 6*a* is electrically coupled to the first power supply output 5*a*, and a second power supply line 6*b* is electrically coupled to the second power supply output 5*b*, respectively.

$L_1$ represents an inductivity of the first power supply line 6*a*, and $R_1$ represents a resistance of the first power supply line 6*a*. Similarly, $L_2$ represents an inductivity of the second power supply line 6*b*, and $R_2$ represents a resistance of the second power supply line 6*b*.

The first and second power supply lines 6*a*, 6*b* are electrically coupled to first and second input terminals 16*a*, 16*b* of the SSPC 8. The SSPC 8 further comprises first and second output terminals 19*a*, 19*b*.

The SSPC 8 is switchable between an on-state and an off-state. When switched into its on-state, the SSPC 8 electrically couples the first output terminal 19*a* to the first input terminal 16*a* and the second output terminal 19*b* to the second input terminal 16*b*, respectively.

When switched into its off-state, the SSPC 8 electrically isolates the first output terminal 19*a* from the first input terminal 16*a* and also isolates the second output terminal 19*b* from the second input terminal 16*b*, respectively.

First and second load power supply lines 9*a*, 9*b* electrically couple an electric load 10 to the first and second output terminals 19*a*, 19*b* of the SSPC 8. In consequence, the supply of electric power from the symmetric power supply 4 to the electric load 10 may be controlled by controlling the SSPC 8.

In FIG. 2, $L_3$ represents an inductivity of the first load power supply line 9*a*, and $R_3$ represents a resistance of the first load power supply line 9*a*. $L_4$ represents an inductivity of the second load power supply line 9*b*, and $R_4$ represents a resistance of the second load power supply line 9*b*. The electric load 10 has an inductivity $L_5$ and a resistance $R_5$. The first load power supply line 9*a*, the electric load 10, and the second load power supply line 9*b* constitute a load circuit 11 of the aircraft electric power supply system 2.

The SSPC 8 comprises a first electric power switching device 10*a*, which is switchable between an on-state, in which the first electric power switching device 10*a* electrically couples the first output terminal 19*a* to the first input terminal 16*a*, and an off-state, in which the first electric power switching device 10*a* electrically isolates the first output terminal 19*a* from the first input terminal 16.

The SSPC 8 further comprises a second electric power switching device 10*b*, which is switchable between an on-state, in which the second electric power switching device 10*b* electrically couples the second output terminal 19*b* to the second input terminal 16*b*, and an off-state, in which the second electric power switching device electrically isolates the second output terminal 19*b* from the second input terminal 16*b*.

In other words, the power supply voltages U+/U− supplied by the symmetric power supply 4 are applied to the first and second output terminals 19*a*, 19*b* when the SSPC 8 is switched into its on-state, and no electric voltages are applied to the first and second output terminals 19*a*, 19*b* when the SSPC 8 is switched into its off-state.

Each of the first and second electric power switching devices 10*a*, 10*b* may be formed by at least one solid state switching device, for example an FET, in particular a MOSFET.

The first and second electric power switching devices 10*a*, 10*b* may be configured to withstand transient voltage peaks $U_{trans}$ of up to 900 V, in particular transient voltage peaks $U_{trans}$ of up to 1200 V.

The first and second electric power switching devices may be configured to withstand transient electric currents $I_{trans}$ of up to 25 A.

The SSPC 8 also comprises a switch controller 20 for controlling the operation of the first and second electric power switching devices 10*a*, 10*b*. The switch controller 20 may in particular be configured for switching each of the first and second electric power switching devices 10*a*, 10*b* into their respective off-states in case an electric current I flowing through the electric load circuit 11 exceeds a predefined threshold Imax. The electric current I flowing through the electric load circuit 11 may be detected by two independent current sensors provided in both power supply lines 9*a*, 9*b*. The current sensors are not depicted in the figures. Each current sensor may include a shunt resistor (not shown), which is coupled in a serial configuration with the electric load 10.

For absorbing transient voltage peaks that are generated over the first and second electric power switching devices 10*a*, 10*b* when the first and second electric power switching devices 10*a*, 10*b* are switched into their off-states, a first clamping circuit 12*a* is connected in parallel to the first electric power switching device 10*a*, and a second clamping circuit 12*b* is connected in parallel to the second electric power switching device 10*b*, respectively.

The freewheeling diode 14 clamps the negative voltage generated by the inductivity $L_5$ of the load 10 and/or inductivities $L_3$, La of the load power supply lines 9*a*, 9*b*, so that the inductive energy is dissipated in the load 10.

Each of first and second clamping circuits 12*a*, 12*b* may comprise a clamping diode 13*a*, 13*b*, in particular a TVS diode, which is connected in its blocking direction parallel to the respective electric power switching device 10*a*, 10*b*. The clamping diodes 13*a*, 13*b* are oriented in their respective blocking direction with respect to the voltages $U_+$, $U_-$ supplied by the aircraft power supply 4 in normal operation.

In an alternative embodiment, which is not explicitly shown in the figures, the first and second clamping circuits 12*a*, 12*b* may by active clamping circuits 12*a*, 12*b* comprising active switching elements, such as FETs, in particular MOSFETs, which are configured for absorbing transient voltage peaks that are generated over the first and second electric power switching devices 10*a*, 10*b* when the first and second electric power switching devices 10*a*, 10*b* are switched into their respective off-states.

For absorbing transient voltage peaks that are generated by the inductivities $L_3$, $L_4$ of the first and second load power supply lines 9*a*, 9*b* and/or the inductivity $L_5$ of the electric load 10 when the first and second electric power switching devices 10*a*, 10*b* are switched into their respective off-states, a freewheeling diode 14 is connected in its blocking direction between the first and second output terminals 19*a*, 19*b* of the SSPC 8.

For dissipating transient voltage peaks that are induced in the aircraft electric power supply system 2, in particular in the first and second power supply lines 6*a*, 6*b*, when the first and second electric power switching devices 10*a*, 10*b* are switched from their respective on-states into their respective off-states, an energy dumping circuit 18 is coupled between the first and second power supply lines 6*a*, 6*b*. The energy dumping circuit 18 is in particular coupled between the first and second input terminals 16*a*, 16*b* of the SSPC 8.

For interrupting the supply of electric power from the symmetric electric power supply 4 via the SSPC 8 to the electric load 10, for example when an overcurrent has been detected, the switch controller 20 is configured for synchronously switching the first and second electric power switching devices 10*a*, 10*b* from their respective on-states into their respective off-states.

The switch controller 20 is in particular configured for synchronously switching the first and second electric power switching devices 10*a*, 10*b* from their respective on-states into their respective off-states. In the context of the present invention, "synchronously switching" the first and second electric power switching devices 10*a*, 10*b* means that the time difference between switching the first and second electric power switching devices 10*a*, 10*b* is less than 10 μs, in particular less than 5 μs, more particular less than 1 μs.

The break-through voltage $U_{break}$ of the energy dumping circuit 18 is set to be in the window between the supply voltage that is applied to the power supply lines 6*a*, 6*b* and the transient voltage $U_{trans}$, which is generated in the aircraft electric power supply system 2 when the electric power switching devices 10*a*, 10*b* are synchronously switched off.

As a result, the transient voltage, $U_{trans}$, which is induced in the power supply lines 6*a*, 6*b*, when the electric power switching devices 10*a*, 10*b* are synchronously switched off, is efficiently dissipated by the energy dumping circuit 18.

Due to such a synchronous switching off the first and second electric power switching devices 10*a*, 10*b*, the transient inductive voltage $U_{trans}$, which is induced aircraft electric power supply system 2 when the electric power switching devices 10*a*, 10*b* are synchronously switched off, is considerably higher than in a case in which only one of the electric power switching devices 10*a*, 10*b* is switched off or in case the two electric power switching devices 10*a*, 10*b* are switched off one after the other with a considerably period of time of delay, in particular with a period of time of delay of more than 10 μs. The induced transient inductive voltage $U_{trans}$ may in particular be approximately twice as high as in a configuration in which only one of the electric power switching devices 10*a*, 10*b* is switched off.

In consequence, the window between the supply voltage that is applied to the power supply lines 6*a*, 6*b* and the transient voltage $U_{trans}$ is considerably larger than in a configuration in which only one of the electric power switching devices 10*a*, 10*b* is switched off or in case the two electric power switching devices 10*a*, 10*b* are switched off one after the other with a considerably period of time of delay.

Due to the enlarged size of said window, it is considerably easier to design the energy dumping circuit 18 such that the break-through voltage $U_{break}$ of the energy dumping circuit 18 falls within said window. As a result, the designing and dimensioning of the dumping circuit may by considerably facilitated, and/or less expensive components may be used.

In the exemplary embodiment depicted in FIG. 2, the energy dumping circuit 18 comprises a TVS diode 17, which is connected in its blocking direction between the first and second input terminals 16*a*, 16*b* of the SSPC 8. Again, the "blocking direction" refers to the voltages U+, U− supplied by the aircraft power supply 4 in normal operation.

In case the symmetric electric power supply 4 is configured to provide output voltages in the range of +/−250 V to +/−300 V with respect to the ground potential GND, the break through voltage of the TVS diode 17 may be set to a value in the range of 900 V to 2000 V.

Figure 3:
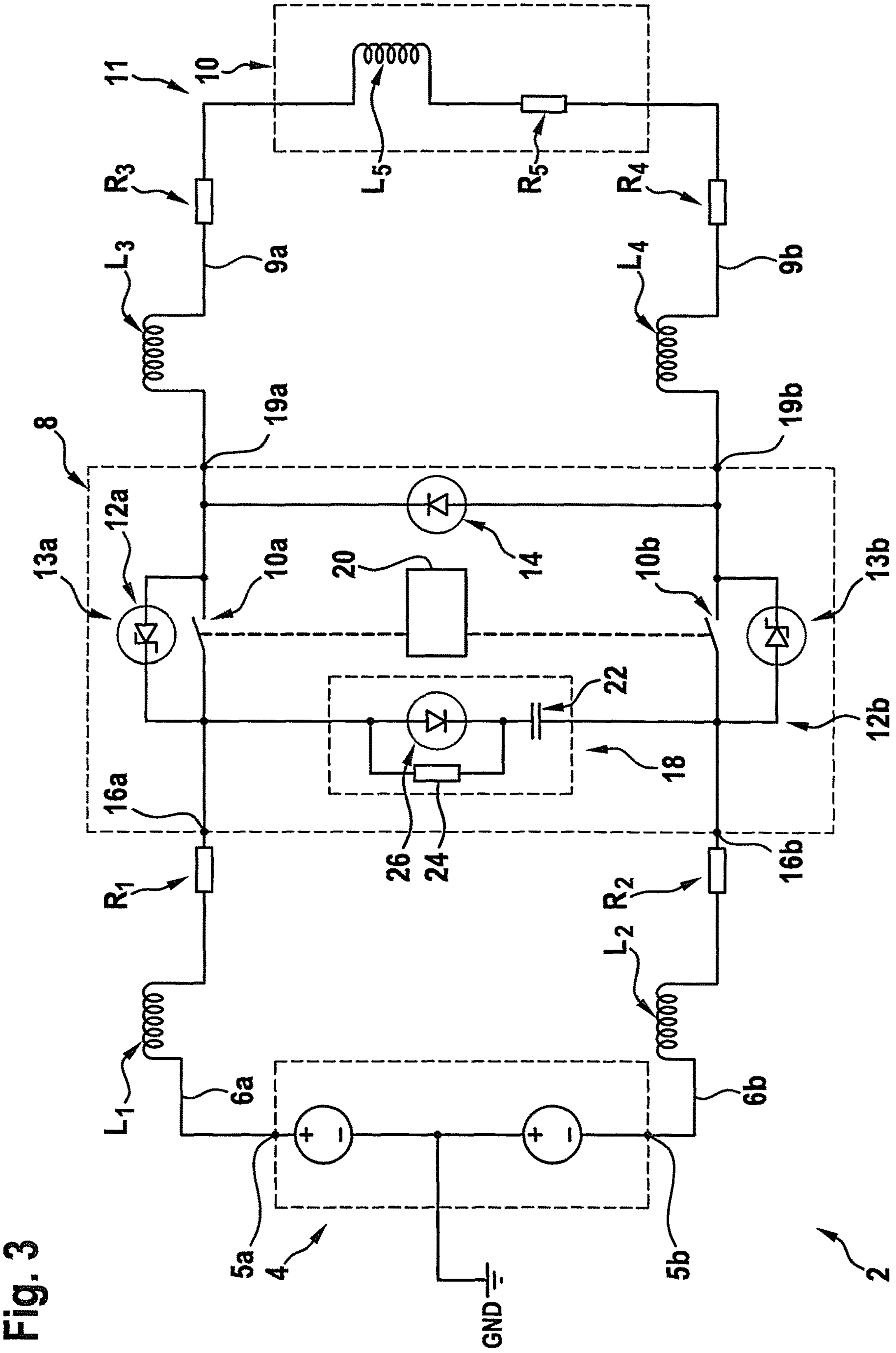
FIG. 3 depicts an electric circuit diagram of an aircraft electric power supply system comprising an SSPC according to another exemplary embodiment of the invention.

FIG. 3 depicts an electric circuit diagram of an aircraft electric power supply system 2 comprising an SSPC 8 according to another exemplary embodiment of the invention.

The components of the aircraft electric power supply system 2 depicted in FIG. 3 that are identical to the components of the aircraft electric power supply system 2 depicted in FIG. 2 are denoted with the same reference signs, and they are not discussed in detail again. Instead, with respect to these components, it is referred to the description of FIG. 2.

The SSPC 8 depicted in FIG. 3 differs from the SSPC 8 depicted in FIG. 2 in that the energy dumping circuit 18 is not provided by a TVS diode 17, but as a snubber circuit 18. The snubber circuit 18 comprises a snubber capacitor 22, a snubber resistor 24 and a snubber diode 26. The snubber resistor 24 and the snubber diode 26 are electrically coupled in parallel to each other. The snubber capacitor 22 is serially coupled to the combination of the snubber resistor 24 and the snubber diode 26.

The snubber diode 26 is oriented in its conducting direction, and the snubber capacitor 22 is configured for absorbing the transient energy, which is generated by induction in the aircraft electric power supply system 2, when the electric power switching devices 10*a*, 10*b* are synchronously switched off, as it has been described before with respect to the embodiment depicted in FIG. 2.

The snubber capacitor may have an electric capacity in the range of 1 μF to 100 μF, in particular in the range of 1 μF to 10 μF or in the range of 10 μF to 100 μF, respectively.

The snubber resistor may have an electric resistance in the range of 1 kΩ to 100 kΩ, in particular in the range of 1 kΩ to 10 kΩ or in the range of 10 kΩ to 100 kΩ, respectively.

When a snubber circuit 18 is employed, the transient energy, which is generated by induction in the aircraft electric power supply system 2, in particular in the first and second power supply lines 6*a*, 6*b*, when the electric power switching devices 10*a*, 10*b* are synchronously switched off, is first absorbed by the snubber capacitor 22. The transient energy, which is absorbed in the snubber capacitor 22, may be dissipated later. Alternatively, it may be recuperated. As a result, the implementation of a snubber circuit 18 provides additional flexibility in the thermal design of the aircraft electric power supply system 2.

While the invention has been described with reference to an exemplary embodiment, it will be understood by those skilled in the art that various changes may be made and equivalents may be substituted for elements thereof without departing from the scope of the invention. In addition, modifications may be made to adapt a particular situation or material to the teachings of the invention without departing from the essential scope thereof. Therefore, it is intended that the invention is not limited to the particular embodiment disclosed, but that the invention will include all embodiments falling within the scope of the appended claims.

What is claimed is:

1. An aircraft solid state power controller for controlling electric power in an aircraft, wherein the electric power is provided by a symmetric electric power supply, which provides (i) a positive supply voltage with respect to a common ground at one of first and second power supply outputs of the symmetric electric power supply and (ii) a negative supply voltage with respect to the common ground at the other one of the first and second power supply outputs of the symmetric electric power supply, wherein the aircraft solid state power controller comprises:

a first input terminal configured to be electrically coupled to the first power supply output of the symmetric electric power supply;

a first output terminal;

a first electric power switching device, which is switchable between (i) an on-state in which the first electric power switching device electrically couples the first output terminal with the first input terminal and (ii) an off-state in which the first electric power switching device electrically isolates the first output terminal from the first input terminal;

a second input terminal configured to be electrically coupled to the second power supply output of the symmetric electric power supply;

a second output terminal;

a second electric power switching device, which is switchable between (i) an on-state in which the second electric power switching device electrically couples the second output terminal with the second input terminal and (ii) an off-state in which the second electric power switching device electrically isolates the second output terminal from the second input terminal;

a switch controller configured to control operation of the first and second electric power switching devices, wherein the switch controller is configured to synchronously switch the first and second electric power switching devices from their respective on-states into their respective off-states, which generates an induced transient inductive voltage greater than a transient inductive voltage generated by switching of one of the first and second electric power switching devices; and an energy dumping circuit coupled to the first and second input terminals and having a breakdown voltage within a window between the induced transient inductive voltage and a supply voltage including the positive supply voltage and the negative supply voltage, the energy dumping circuit configured to dissipate inductive energy that is generated when the first and second electric power switching devices are switched from their respective on-states into their respective off-states.

2. The aircraft solid state power controller according to claim 1, wherein the switch controller is configured to synchronously switch the first and second electric power switching devices such that a time difference between switching the first and second electric power switching devices is less than 10 μs.

3. The aircraft solid state power controller according to claim 1, wherein the energy dumping circuit comprises a transient voltage suppressor (TVS) diode.

4. The aircraft solid state power controller according to claim 1, wherein the energy dumping circuit comprises a snubber circuit including a snubber capacitor, a snubber resistor, and a snubber diode.

5. The aircraft solid state power controller according to claim 4, wherein at least one of:

the snubber capacitor has an electric capacity in a range of 1 μF to 100 μF; or the snubber resistor has an electric resistance in a range of 1 kΩ to 100 kΩ.

6. The aircraft solid state power controller according to claim 1, further comprising:

a first clamping circuit, which is connected in parallel to the first electric power switching device; and a second clamping circuit, which is connected in parallel to the second electric power switching device;

wherein the first clamping circuit comprises a first clamping diode, which is connected in blocking direction in parallel to the first electric power switching device; and wherein the second clamping circuit comprises a second clamping diode, which is connected in blocking direction in parallel to the second electric power switching device.

7. The aircraft solid state power controller according to claim 1, wherein the first and second electric power switching devices are solid state power switching devices.

8. The aircraft solid state power controller according to claim 1, wherein the first and second electric power switching devices are configured to withstand transient voltage peaks of up to 900 V.

9. The aircraft solid state power controller according to claim 1, wherein the first and second electric power switching devices are configured to withstand transient electric currents of up to 25 A.

10. The aircraft solid state power controller according to claim 1, further comprising:

a freewheeling diode, which is connected in blocking direction between the first and second output terminals.

11. An aircraft comprising the aircraft solid state power controller according to claim 1.

12. The aircraft solid state power controller according to claim 1, wherein the energy dumping circuit is coupled between the first and second input terminals without being coupled to the common ground.

13. An aircraft power supply system comprising a symmetric electric power supply configured to provide (i) a positive supply voltage with respect to a common ground at one of first and second power supply outputs of the symmetric electric power supply and (ii) a negative supply voltage with respect to the common ground at the other one of the first and second power supply outputs of the symmetric electric power supply; and an aircraft solid state power controller comprising:

a first input terminal configured to be electrically coupled to the first power supply output of the symmetric electric power supply;

a first output terminal;

a first electric power switching device, which is switchable between (i) an on-state in which the first electric power switching device electrically couples the first output terminal with the first input terminal and (ii) an off-state in which the first electric power switching device electrically isolates the first output terminal from the first input terminal;

a second input terminal configured to be electrically coupled to the second power supply output of the symmetric electric power supply;

a second output terminal;

a second electric power switching device, which is switchable between (i) an on-state in which the second electric power switching device electrically couples the second output terminal with the second input terminal and (ii) an off-state in which the second electric power switching device electrically isolates the second output terminal from the second input terminal;

a switch controller configured to control operation of the first and second electric power switching devices, wherein the switch controller is configured to synchronously switch the first and second electric power switching devices from their respective on-states into their respective off-states, which generates an induced transient inductive voltage greater than a transient inductive voltage generated by switching of one of the first and second electric power switching devices; and an energy dumping circuit coupled to the first and second input terminals and having a breakdown voltage within a window between the induced transient inductive voltage and a supply voltage including the positive supply voltage and the negative supply voltage, the energy dumping circuit configured to dissipate inductive energy that is generated when the first and second electric power switching devices are switched from their respective on-states into their respective off-states.

14. The aircraft power supply system according to claim 13, wherein the symmetric electric power supply is configured to supply electric DC power with voltages in a range of ±250 V to ±300 V with respect to the common ground.

15. A method of switching an aircraft solid state power controller, which is electrically coupled to a symmetric electric power supply that provides (i) a positive supply voltage with respect to a common ground at one of first and second power supply outputs of the symmetric electric power supply and (ii) a negative supply voltage with respect to the common ground at the other one of the first and second power supply outputs of the symmetric electric power supply, wherein the aircraft solid state power controller comprises:

a first input terminal electrically coupled to a first power supply output of the symmetric electric power supply;

a first output terminal;

a first electric power switching device, which is switchable between (i) an on-state in which the first electric power switching device electrically couples the first output terminal with the first input terminal and (ii) an off-state in which the first electric power switching device electrically isolates the first output terminal from the first input terminal;

a second input terminal electrically coupled to a second power supply output of the symmetric electric power supply;

a second output terminal;

a second electric power switching device, which is switchable between (i) an on-state in which the second electric power switching device electrically couples the second output terminal with the second input terminal and (ii) an off-state in which the second electric power switching device electrically isolates the second output terminal from the second input terminal; and an energy dumping circuit coupled to the first and second input terminals and configured to dissipate inductive energy that is generated when the first and second electric power switching devices are switched from their respective on-states into their respective off-states;

wherein the method comprises:

synchronously switching the first and second electric power switching devices from their respective on-states into their respective off-states, which generates an induced transient inductive voltage greater than a transient inductive voltage generated by switching of one of the first and second electric power switching devices; and dissipating energy that is generated when the first and second electric power switching devices are switched from their respective on-states into their respective off-states in the energy dumping circuit, the energy dumping circuit having a breakdown voltage within a window between the induced transient inductive voltage and a supply voltage including the positive supply voltage and the negative supply voltage.

16. The method according to claim 15, wherein synchronously switching the first and second electric power switching devices comprises:

synchronously switching the first and second electric power switching devices such that a time difference between switching the first and second electric power switching devices is less than 10 μs.

17. The method according to claim 15, wherein the first and second electric power switching devices are solid state power switching devices.

18. The method according to claim 15, wherein the first and second electric power switching devices are configured to withstand transient voltage peaks of up to 900 V.

19. The method according to claim 15, wherein the first and second electric power switching devices are configured to withstand transient electric currents of up to 25 A.

20. The method according to claim 15, wherein the symmetric electric power supply is configured to supply electric DC power with voltages in a range of ±250 V to ±300 V with respect to the common ground.

21. The method according to claim 15, wherein the energy dumping circuit comprises at least one of:

a transient voltage suppressor (TVS) diode; or a snubber circuit including a snubber capacitor, a snubber resistor, and a snubber diode.

* * * * *